United States Patent [19]

Uchimura et al.

[11] Patent Number: 4,622,480
[45] Date of Patent: Nov. 11, 1986

[54] SWITCHED CAPACITOR CIRCUIT WITH HIGH POWER SUPPLY PROJECTION RATIO

[75] Inventors: Kuniharu Uchimura; Atushi Iwata, both of Saitama, Japan

[73] Assignee: Nippon Telegraph & Telephone Public Corporation, Tokyo, Japan

[21] Appl. No.: 487,523

[22] Filed: Apr. 22, 1983

[30] Foreign Application Priority Data

Apr. 26, 1982 [JP] Japan ................................. 57-69821

[51] Int. Cl.[4] ............................................. G05F 5/00
[52] U.S. Cl. .................................... 307/491; 307/496; 307/497; 307/297; 307/520; 307/200 B; 330/261
[58] Field of Search ............... 307/352, 353, 490, 491, 307/493, 494, 497, 297, 520, 523, 577, 579, 584, 585, 200 B, 496; 328/127, 142, 151; 330/253, 258, 261, 254; 333/165, 166

[56] References Cited

U.S. PATENT DOCUMENTS

| | | | |
|---|---|---|---|
| 4,267,517 | 5/1981 | Iida et al. | 330/258 X |
| 4,300,061 | 11/1981 | Mihalich et al. | 307/297 |
| 4,361,797 | 11/1982 | Kojima et al. | 307/297 X |
| 4,379,267 | 4/1983 | Young | 330/258 X |
| 4,477,737 | 10/1984 | Ulmer et al. | 307/297 |
| 4,479,093 | 10/1984 | Mattisson | 330/258 |
| 4,484,089 | 11/1984 | Viswanathan | 307/297 |
| 4,518,880 | 5/1985 | Masuda et al. | 307/297 X |

*Primary Examiner*—John S. Heyman
*Assistant Examiner*—D. R. Hudspeth
*Attorney, Agent, or Firm*—Roberts, Spiecens & Cohen

[57] ABSTRACT

In a switched capacitor circuit, in order to eliminate leakage of a power supply noise component to a signal line through an input capacitance of an operation amplifier, (1) an operating current of at least a first, differential stage among stages of the operational amplifier is regulated by a current regulation bias circuit, and (2) a power supply noise component having the same phase as that of an input signal is applied to the gate of a transistor of a gain stage, thereby stabilizing the operating point. In order to eliminate leakage of the power supply noise component to the signal line through a parasitic capacitance of an analog switch, (3) a dummy switch is used to detect a signal corresponding to the leakage component of the power supply noise component to the signal line, and an inverted signal having the opposite phase to that of the signal corresponding to the leakage component is applied to a substrate of the analog switch, thereby cancelling the actual leakage component.

17 Claims, 25 Drawing Figures

SWITCHED CAPACITOR CIRCUIT WITH HIGH POWER SUPPLY PROJECTION RATIO

BACKGROUND OF THE INVENTION

The present invention relates to a switched capacitor circuit applicable to various types of analog circuit such as a high precision low-pass filter, an A/D converter and a D/A converter and, more particularly, to a switched capacitor circuit which comprises a MOS integrated circuits.

A switched capacitor circuit basically comprises: an operational amplifier; a sampling circuit having two analog switches which are alternately turned on/off in accordance with sampling clocks; and a capacitor which is alternately connected to a signal input and an inverting input of the operational amplifier in accordance with the on/off operation of the analog switches so as to transfer a charge corresponding to an input voltage by charging/discharging; and an integrating capacitor connected between an output of the operational amplifier and the inverting input thereof so as to integrate an input signal.

When the switched capacitor circuit of the type described above comprises a CMOS device, parasitic capacitances are present in the gate-source path and the gate-drain path of an input transistor of the operational amplifier. When power supply voltages ($V_{DD}$, $V_{SS}$) applied to the operational amplifier vary, the source or drain voltage of the input transistor varies, so that charge flows through the parasitic capacitance (i.e., an input capacitance of the operational amplifier) to an imaginary ground point of the inverting input of the operational amplifier. This charge is then integrated by the integrating capacitor.

A change in power supply voltage (i.e., power supply noise) is transmitted by the input capacitance of the operational amplifier to a signal line of the switched capacitor circuit, thereby degrading the signal-to-noise (S/N) ratio. In other words, a power supply rejection ratio (PSRR) is degraded. Leakage of power supply noise by the input capacitance to the signal line is a first cause of degradation of the electrical characteristics of the switched capacitor circuit.

The two analog switches comprise a PMOS and an NMOS, respectively. Parasitic capacitances are present in the gate-source path and the gate-drain path of the PMOS, the path between the source of the PMOS and an N-substrate, and the path between the drain thereof and the N-substrate. Similarly, parasitic capacitances are present in the gate-source path and the gate-drain path of the NMOS, the path between the source thereof and a P-well region, and the path between the drain thereof and the P-well region. A clock of a power supply voltage is applied to the gates of the NMOS and PMOS so as to turn on/off the corresponding analog switches. When this power supply voltage varies, charge flows to the imaginary ground point of the operational amplifier through the parasitic capacitances. This charge is integrated by the integrating capacitive element. This is a second cause of degradation of the power supply rejection ratio of the switched capacitor circuit.

Since the parasitic capacitance is present in any other device as well as the MOS device, the same problem occurs even if the switched capacitor circuit comprises any device other than the MOS device.

Power supply noise components include the following noise components. First, noise occurs in a power supply itself: in particular, a 100-kHz clock leaks in a switching regulator. Second, the power supply voltage varies in accordance with the operation of logic circuits on a single chip. Third, noise occurs as crosstalk from peripheral logic LSIs. These noise components are generated in a wide frequency bandwidth. For example, when a PCM-CODEC LSI is used, many power supply noise components are present since a compact built-in power source is used and 1k-gate logic circuits are integrated on a single chip.

Furthermore, since an analog signal is sampled with a switching frequency, a high-frequency component which is higher than the switching frequency causes aliasing to fall below the switching frequency. For this reason, the high-frequency component is superposed on a signal in a signal range which corresponds to an actual noise range.

As described above, the power supply noise components are present in a wide frequency bandwidth. Furthermore, the power supply noise components leak to the signal line through the parasitic capacitances. As a result, a high-performance switched capacitor circuit cannot be obtained.

In order to eliminate the first cause of degradation of the switched capacitor circuit, a method is proposed for forming an on-chip circuit for regulating the negative power supply voltage (Harlan Ohara et al., "A Precision Low-Power PCM Channel Filter with On Chip Power Supply Regulation", IEEE Journal of Solid-State Circuits, Vol. SC-15, No. 6, December 1980, PP. 1005-1013). According to this method, since a power supply circuit is regulated, a large-sized transistor is required and high power is required to regulate the power supply voltage in a wide frequency range. Furthermore, since the voltage regulator is arranged between the power supply and the amplifier, the signal magnitude is slightly decreased, resulting in inconvenience.

In order to eliminate the second cause of degradation of the switched capacitor circuit, a method is proposed wherein a P-well layer is formed between a MOS switch and a substrate and the P-well layer is biased by a regulated voltage (Douglas G. Marsh et al., "A Single-Chip CMOS PCM Codec with Filters", IEEE Journal of Solid-State Circuits, Vol. SC-16, No. 4, August 1981, PP. 308-315). This method has advantages in having a compact circuit architecture and low power dissipation. However, this method can only be applied for an NMOS transistor, so the signal magnitude is limited as compared with the case of a CMOS. Furthermore, since this method disables elimination of the power supply noise components transmitted through the input capacitance of the operational amplifier and the gate capacitance of the switch, a great improvement in the power supply rejection ratio cannot be expected.

SUMMARY OF THE INVENTION

It is, therefore, an object of the present invention to provide a switched capacitor circuit having a novel means for preventing degradation of an S/N ratio which is caused by a change in power supply voltage (i.e., by leakage of power supply noise components to a signal line through various parasitic capacitances). The first and second causes of degradation of the power supply rejection ratio in the switched capacitor circuit are thus to be eliminated.

According to a first aspect of the present invention, in order to solve the leakage of the power supply noise component to the signal line through an input capacitance of a differential stage which constitutes an input section of the operational amplifier (i.e., in order to eliminate the first cause), the switched capacitor circuit according to the present invention is characterized in that an operating current flowing at least in a differential input stage among gain-stages of the operational amplifier is regulated irrespective of a change in power supply voltage. This regulation is performed by keeping constant the gate-source voltage of a MOS transistor for determining the operating current flowing in each gain-stage. More specifically, for this purpose, the switched capacitor circuit is characterized by comprising a current regulating bias circuit which has current mirror circuits responsive to a stable reference voltage $V_{REF}$.

According to a second aspect of the present invention, the switched capacitor circuit is characterized in that the operating point of a gain stage of the operational amplifier is stabilized irrespective of a change in power supply voltage. For this purpose, the switched capacitor circuit is characterized by comprising an operating point stabilizing bias circuit wherein a power supply variation component is applied to the gate of a drive MOS transistor of a gain stage such that the power supply variation component has the same phase as a variation component included in the power supply voltage applied to the source thereof so as to keep the gate-source voltage thereof constant irrespective of a change in power supply voltage.

It should be noted that one of the current regulator and the operating point stabilizing bias circuit may be used to improve the S/N ratio. However, when these circuits are used in the switched capacitor circuit, a further improvement can be obtained.

According to a third aspect of the present invention, in order to eliminate the second cause of degradation wherein the power supply noise components leak to the signal line through the parasitic capacitances between the path between the drain of the MOS transistor and the substrate or between the source thereof and the substrate, the switched capacitor circuit is characterized by comprising a substrate bias circuit with a dummy switch which has the same arrangement as the analog switch and has the same parasitic capacitance thereas. The dummy switch detects a voltage corresponding to a leak component in the analog switch which is subject to a change in power supply voltage. A voltage of the opposite-phase to that detected by the dummy switch is applied to the substrate of the MOS transistor of the analog switch, thereby cancelling the leak component in the analog switch.

According to the present invention, the switched capacitor circuit comprises a current regulation bias circuit, an operating point stabilizing bias circuit, and a substrate bias circuit so as to improve a power supply rejection ratio (a ratio for rejecting a power supply voltage variation transmission to the signal line). It should be noted that one or two of the bias circuits may be selectively used for a desired application of the switched capacitor circuit so as to obtain a power supply rejection ratio which is sufficiently high in practice, although all of the bias circuits are used in the switched capacitor circuit for a maximum effect. For example, when a small number of analog switches is used, the substrate bias circuit may be omitted.

In a high-performance, low-cost switched capacitor circuit which has a high power supply rejection ratio according to the present invention, a high S/N ratio can be guaranteed even if a power supply voltage is supplied from a switching regulator which has many pulsive noise components. The switched capacitor circuit has an advantage in that an expensive, high-performance power source need not be used. Furthermore, when the switched capacitor circuit and the logic circuit are formed on a single chip, a pulsive noise component appearing in the logic circuit through a common power supply wiring layer and the common substrate may not leak in the switched capacitor circuit, thereby readily realizing a high-performance large scale integrated circuit and hence resulting in convenience. Furthermore, according to the present invention, since an integrated circuit which includes the switched capacitor circuit and which processes an analog signal can be formed on a single printed circuit board together with an integrated circuit which has logic circuits, and a single power supply can be used, a simple, low-cost, compact circuit can be arranged.

BRIEF DESCRIPTION OF THE DRAWINGS

FIG. 13A shows a basic circuit arrangement thereof, and FIG. 13B shows the substrate bias circuit thereof;

DETAILED DESCRIPTION OF THE PREFERRED EMBODIMENTS

In order to best understand the present invention, causes of degradation of a power supply rejection ratio (PSRR) in a conventional switched capacitor IC (to be improved upon by the present invention) will be described.

Figure 1:
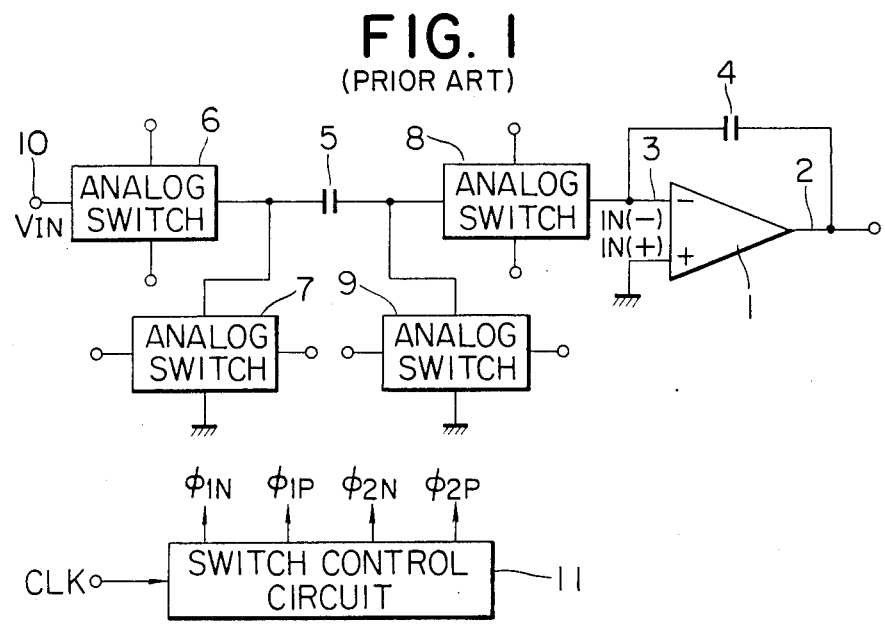
FIG. 1 is a block diagram showing the basic circuit configuration of a conventional switched capacitor circuit.

FIG. 1 shows a basic circuit arrangement of a conventional switched capacitor circuit. Referring to FIG. 1, an integrating capacitor 4 is connected between an output 2 of an operational amplifier 1 and one inverting input 3 thereof. One end of a sampling capacitor 5 is connected to one end of each of analog switches 6 and 7. The other end of the sampling capacitor 5 is connected to one end of each of analog switches 8 and 9. The other end of the analog switch 6 is connected to a signal input 10, and the other end of the analog switch 8 is connected to the inverting input 3 of the operational amplifier 1. The other end of each of the analog switches 7 and 9 is grounded. Control inputs of the analog switches 6, 7, 8 and 9 are connected to outputs of a switch control circuit 11 which produces switch control signals $\phi_{1N}$, $\phi_{1P}$, $\phi_{2N}$ and $\phi_{2P}$, respectively. The ON/OFF operations of the analog switches 6, 7, 8 and 9 are controlled by these switch control signals, respectively.

When the analog switches 6 and 9 are ON and the analog switches 7 and 8 are OFF, the capacitor 5 is charged by an input voltage $V_{in}$ from the signal input 10. When the analog switches 6 and 9 are OFF and the analog switches 7 and 8 are ON, the charge on the sampling capacitor 5 is integrated by the integrating capacitor 4. An integration time constant is $C_1/(C_2 \cdot f_{CLK})$ where $C_1$ is the capacitance of the integrating capacitor 4, $C_2$ is the capacitance of the sampling capacitor 5, and $f_{CLK}$ is the repetition frequency of the ON/OFF operation of the analog switch (the clock frequency of the switch control circuit 11). The integration time constant is determined by the ratio $C_1/C_2$ of the capacitance of the integrating capacitor 4 to that of the sampling capacitor 5, and the clock frequency $f_{CLK}$. Therefore, a large time constant can be obtained with a small capacitance. According to the switched capacitor circuit, a capacitive element formed on a substrate of an IC and having a small capacitance can be used as a time constant element; an integrator or a filter having a large time constant can be formed into an integrated circuit, thereby obtaining a compact circuit. Therefore, the switched capacitor circuit has been widely used as the time constant circuit of an IC.

However, when the switched capacitor circuit is formed on a single IC chip, a noise component which is included in a power supply leaks to a signal line, resulting in inconvenience. The leakage of the power supply noise component to the signal line is evaluated by a power supply rejection ratio. The degradation of the power supply rejection ratio in the conventional switched capacitor IC arises from the following two causes.

Figure 2:
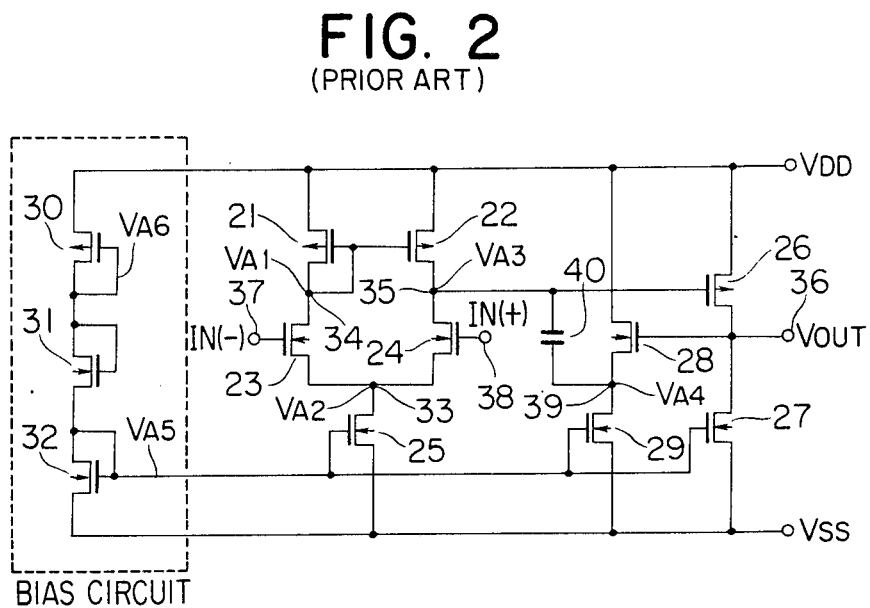
FIG. 2 is a circuit diagram showing an example of a conventional operational amplifier used for the circuit shown in FIG. 1.
Figure 3A:
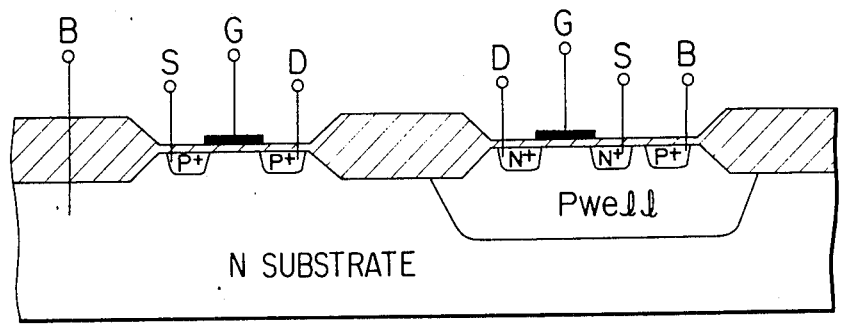
FIG. 3A is a sectional view showing the structure of a CMOS device.
Figure 3B:
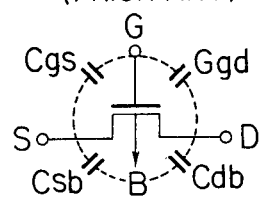
FIGS. 3B and 3C show parasitic capacitances of the CMOS device shown in FIG. 3A.
Figure 3C:
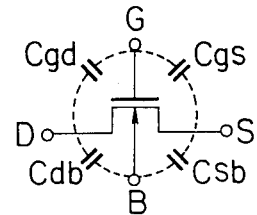
Figure 4:
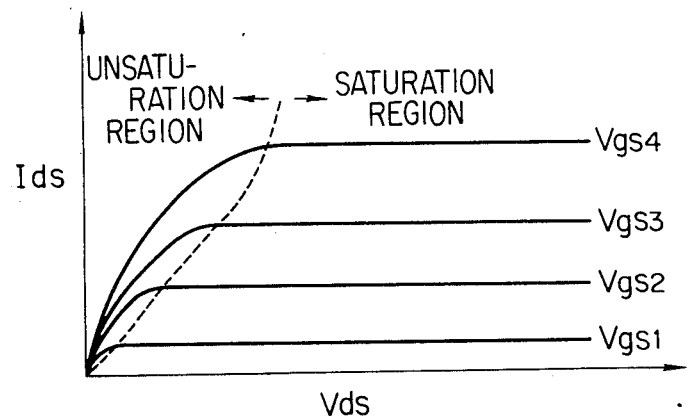
FIG. 4 is a graph for explaining the drain-source current $I_{ds}$ as a function of the drain-source voltage $V_{ds}$.

The first cause results from the fact that charge is transferred to the inverting input 3 through an input capacitance of the inverting input 3 by a node voltage of the operational amplifier which changes in accordance with a power supply voltage variation. FIG. 2 shows an example of a conventional CMOS operational amplifier. In the case of integrating a switched capacitor circuit, a MOS manufacturing process is utilized since the capacitive element structure of the switched capacitor circuit resembles that of the MOS transistor, the manufacturing process may not become complex, and an input impedance of the amplifier can be greatly increased. Among these advantages, the switching and amplification characteristics allow an application of the CMOS manufacturing process. The CMOS operational amplifier shown in FIG. 2 comprises: a differential stage which comprises transistors 21 to 25; a gain stage which comprises transistors 26 and 27; a frequency compensation buffer which comprises transistors 28 and 29; a bias circuit which comprises transistors 30 to 32; and a frequency compensation capacitor 40. FIG. 3A shows a section of the CMOS device structure. A capacitance $C_{gd}$ between a gate G and a drain D of the MOS transistor, a parasitic capacitance $C_{gs}$ between the gate G and a source S, a parasitic capacitance $C_{db}$ between the drain D and a substrate B, and a parasitic capacitance $C_{sb}$ between the source S and the substrate B are generated as shown in FIG. 3B. As may be apparent from the structure of the P-channel MOS transistor as shown in FIG. 3A, although the substrate is commonly used for the respective transistors, the N-channel MOS transistor is formed in a P-element isolation diffusion layer (to be referred to as a P-well layer hereinafter), thereby isolating the P-channel MOS transistor from the N-channel MOS transistor. FIG. 4 shows voltage-current characteristics of the MOS transistor. As may be apparent from FIG. 4, the MOS transistor has a constant current in a saturation region with respect to the drain-source voltage $V_{ds}$.

In the operational amplifier shown in FIG. 2, when the power supply voltage $V_{DD}$ or $V_{SS}$ is changed, the operating current in each gain-stage is changed. The operating current in each gain-stage is determined in proportion to a ratio of a channel width to a channel length of each of the transistors 25, 27, 29 and 32, and to a current of the bias circuit. The bias circuit serves to divide the power supply voltage to apply the gate-source voltage $V_{gs}$ across the gate and source of each of the MOS transistors 30, 31 and 32 so as to determine the operating current of each of the transistors. When the power supply voltage is changed, the current flowing through the bias current is changed, and hence the operating current of each gain-stage is changed. When the operating current of the differential stage is changed, the gate-source voltage $V_{gs}$ of each of the transistors 23 and 24 is changed since it is operated in the saturation region. In other words, a voltage $V_{A2}$ at a node 33 is changed. Similarly, voltages $V_{A1}$ and $V_{A3}$ at nodes 34 and 35, respectively, are changed. A negative feedback voltage is applied from an output 36 of the operational amplifier to its input 37, and a change in an output voltage $V_{out}$ at the output 36 can be limited by a gain between the input and output of the operational amplifier. However, the voltage $V_{A1}$ at the node 34 and the voltage $V_{A2}$ at the node 33 may not be controlled by the negative feedback voltage. As a result, charge is transferred to the input 37 through the capacitance $C_{gs}$ between the gate and source of the transistor 23 and the capacitance $C_{gd}$ between the gate and drain thereof. This charge is integrated by the capacitor 4 (FIG. 1) in the switched capacitor circuit, so that a change in the output voltage $V_{out}$ occurs. In general, a MOS transistor has a current noise component greater than that of a bipolar transistor or the like. In order to decrease the current noise component, the gate areas of the transistors 23 and 24 are usually increased. For this reason, the capacitances $C_{gs}$ and $C_{gd}$ of the transistor 23 are considerably large. Therefore, when a CMOS operational amplifier is used in a switched capacitor circuit, it is a very serious problem as to how the power supply rejection ratio of the CMOS operational amplifier may be increased.

Figure 5:
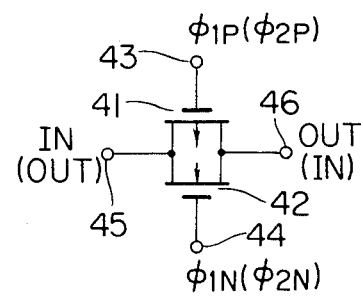
FIG. 5 is a circuit diagram showing an example of a conventional analog switch used for the switched capacitor circuit shown in FIG. 1.
Figure 6:
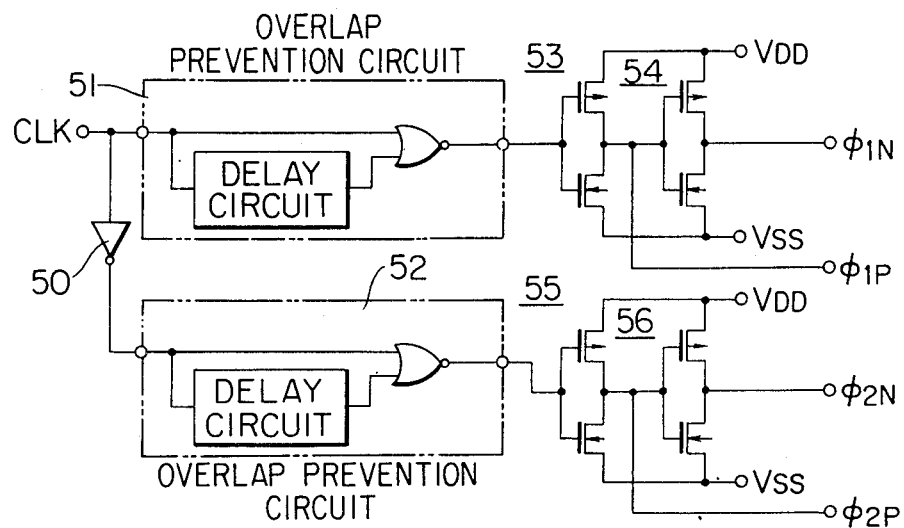
FIG. 6 is a circuit diagram showing a switch control circuit of the switched capacitor circuit shown in FIG. 1.

The second cause results from the fact that a power supply voltage variation is directly transmitted to an input of the operational amplifier through a parasitic capacitance of the MOS transistor constituting the analog switch, and this variation component is integrated by the integrating capacitor. FIG. 5 shows a CMOS analog switch. The CMOS analog switch comprises a P-channel MOS transistor 41 and an N-channel MOS transistor 42. An input 45 and an output 46 are connected and disconnected by applying the switch control signals $\phi_{1N}$ and $\phi_{1P}$ to gates 43 and 44, respectively, of the P- and N-channel MOS transistors 41 and 42. The substrate of the P-channel MOS transistor 41 is connected to a power supply voltage $V_{DD}$, and the substrate of the N-channel MOS transistor 42 is connected to a power supply voltage $V_{SS}$, which are not illustrated in FIG. 5. The switch control signals $\phi_{1N}$, $\phi_{1P}$, $\phi_{2N}$ and $\phi_{2P}$ are generated by a switch control circuit shown in FIG. 6. The switch control circuit comprises an inverter 50, overlap prevention circuits 51 and 52, and inverters 53, 54, 55 and 56 each of which comprises a pair of CMOS transistors. The switch control signals $\phi_{1N}$, $\phi_{1P}$, $\phi_{2N}$ and $\phi_{2P}$ correspond to either of the power supply voltages $V_{DD}$ and $V_{SS}$, and are applied to the gates of the analog switches, which are then turned on/off.

The parasitic capacitances $C_{db}$ and $C_{sb}$ of the P-channel MOS transistor are directly coupled to the power supply voltage $V_{DD}$. The parasitic capacitances $C_{db}$ and $C_{sb}$ of the N-channel MOS transistor are directly coupled to the power supply voltage $V_{SS}$. The parasitic capacitances $C_{gs}$ and $C_{gd}$ of the P- and N-channel MOS transistors are directly coupled to one of the power sources $V_{DD}$ and $V_{SS}$. Referring again to FIG. 1, when the analog switch 8 is OFF, the power supply voltage variation component is supplied to the inverting input 3 of the operational amplifier through the parasitic capacitance of the analog switch 8. However, when the analog switch 8 is ON, the variation component is supplied to the inverting input 3 through the parasitic capacitances of the analog switches 8 and 9. The variation component is then integrated by the capacitor 4.

The second cause is a minor one as compared with the first cause. However, in the case of implementing a high-order filter or the like, the second cause is still a problem since the number of analog switches is increased.

Preferred embodiments of the present invention will be described with reference to the accompanying drawings.

Figure 7:
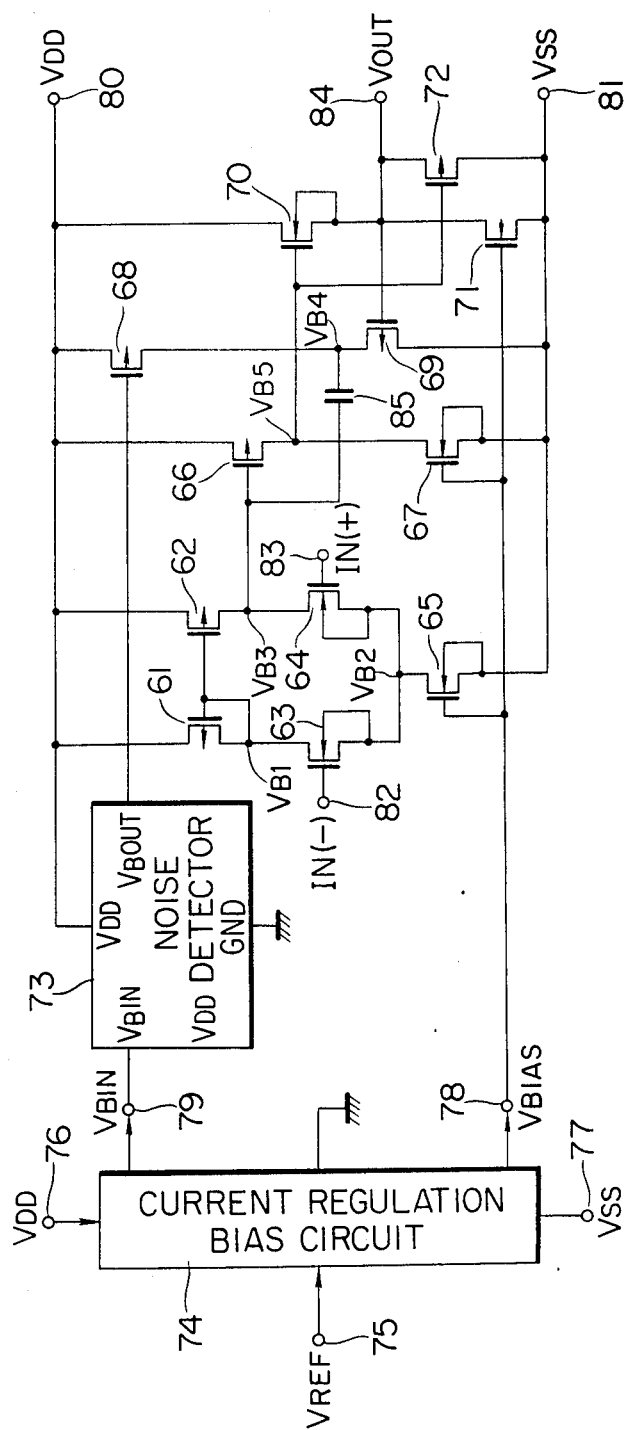
FIG. 7 is a circuit diagram showing a CMOS operational amplifier used for a switched capacitor circuit of the present invention.

FIG. 7 is a CMOS operational amplifier used for a switched capacitor circuit according to an embodiment of the present invention. The CMOS operational amplifier comprises: a differential stage consisting of MOS transistors 61 to 65; a gain stage consisting of MOS transistors 66 and 67; a frequency compensation buffer consisting of MOS transistors 68 and 69; a frequency compensation capacitor 85; an output stage consisting of MOS transistors 70 to 72; a $V_{DD}$ noise detector 73 for detecting a power supply voltage variation; and a current regulation bias circuit 74. The transistors 70 to 72 of the output stage serve to decrease an output impedance and to widen the bandwidth of the gain stage. Basically, the output stage may be omitted. The current regulation bias circuit 74 serves to keep constant the gate-source voltages of the MOS transistor 65 for determining the operating current of the differential stage, the MOS transistor 67 of the gain stage, and the MOS transistor 71 of the output stage.

Figure 8:
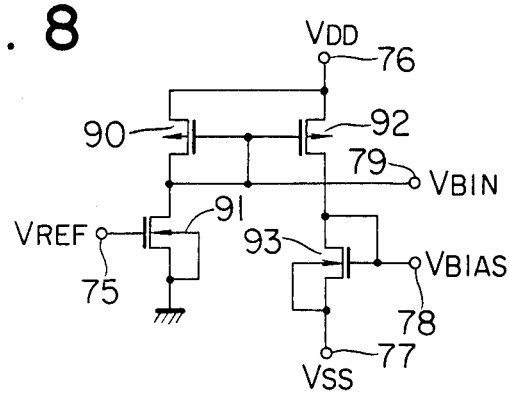
FIG. 8 is a circuit diagram showing a current regulation bias circuit of the operational amplifier shown in FIG. 7.

FIG. 8 shows a detailed arrangement of the current regulation bias circuit. This circuit comprises MOS transistors 90 to 93 which are operated in the saturation region. The reference voltage $V_{REF}$ from an input 75 applied to the gate of the MOS transistor 91 is stable with respect to the ground potential irrespective of variations in the power supply voltages $V_{DD}$ and $V_{SS}$. The gate-source voltage $V_{gs}$ of the MOS transistor 91 is kept constant, so that the currents flowing through the MOS transistors 90 and 91 are kept constant irrespective of variations in the power supply voltage $V_{DD}$. When the power supply voltage $V_{DD}$ is changed, the drain voltage of the MOS transistor 91 is changed together with the power supply voltage $V_{DD}$ so as to keep the gate-source voltage $V_{gs}$ of the MOS transistor 90 constant. Therefore, a voltage $V_{BIN}$ corresponding to a variation in the power supply voltage appears at an output 79 of the regulation bias circuit 74. The sources and gates of the MOS transistors 90 and 92 are commonly connected so as to form a current mirror circuit. Therefore, a constant current flows through the MOS transistor 92 irrespective of the variation in the power supply voltage $V_{DD}$. The gate-source voltage $V_{gs}$ of the MOS transistor 92 is kept constant in accordance with the constant current characteristic of the MOS transistor 92. A voltage $V_{BIAS}$ at an output 78 of the regulation bias circuit 74 is changed together with the power supply voltage $V_{SS}$. Therefore, the MOS transistor 65 (FIG. 7) and the MOS transistor 93 (FIG. 8), the MOS transistor 67 (FIG. 7) and the MOS transistor 93 (FIG. 8), and the MOS transistor 71 (FIG. 7) and the MOS transistor 93 (FIG. 8), whose gates are biased by the voltage $V_{BIAS}$, form current mirror circuits, respectively. The gate-source voltages $V_{gs}$ of the MOS transistors 65, 67 and 71 are kept constant irrespective of variations in the power supply voltages $V_{DD}$ and $V_{SS}$. As a result, the operating current in each gain-stage can be kept constant.

Figure 9:
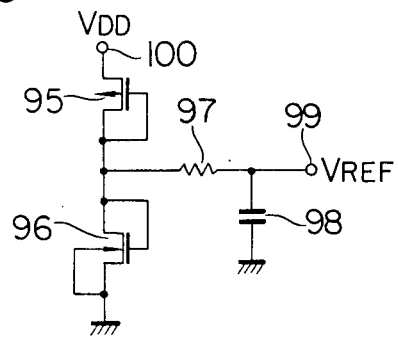
FIG. 9 is a circuit diagram of a reference voltage generator for generating a reference voltage $V_{REF}$ supplied to the current regulation bias circuit shown in FIG. 8.

The reference voltage $V_{REF}$ can be obtained by applying a stable voltage externally of an IC or by arranging a known bandgap $V_{REF}$ circuit which is formed on the IC chip. FIG. 9 is another example of a reference voltage generator for supplying the reference voltage $V_{REF}$ to the input 75 of the current regulation bias circuit. The reference voltage generator is simply arranged wherein a low-pass filter comprising a resistor 97 and a capacitor 98 eliminates an AC component of the power supply noise component and a filtered voltage is produced as the reference voltage $V_{REF}$.

In the CMOS operational amplifier shown in FIG. 7, when the operating current of each gain-stage is kept constant, the node voltage of the operational amplifier is stabilized in accordance with the constant current characteristic of the MOS transistor. In the differential stage consisting of the MOS transistors 61 to 65, when a substrate voltage effect of the N-channel MOS transistors 63 and 64 is great, the threshold voltages of the MOS transistors 63 and 64 are changed together with the substrate-source voltage $V_{SB}$ if the P-well is electrically connected to the power supply voltage $V_{SS}$. Even if the operating current is kept constant, a voltage $V_{B2}$ (which is supposed to be $V_{SB}$) at the node between the sources of the MOS transistors 63 and 64 is changed.

Figure 10:
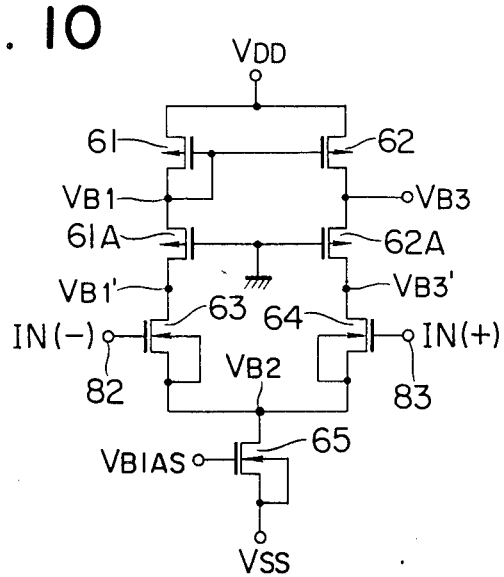
FIG. 10 is a circuit diagram showing a modification of a differential stage of the operational amplifier shown in FIG. 7.

In this case, when the P-well of the MOS transistors 63 and 64 is connected to the node at the voltage $V_{B2}$, the voltage $V_{SB}$ is kept constant and the substrate voltage effect is eliminated. Meanwhile, the voltage $V_{gs}$ of the MOS transistor 61 is kept constant irrespective of variations in the power supply voltage $V_{DD}$, and a drain voltage $V_{B1}$ thereof changes in phase with the power supply voltage $V_{DD}$. The gate capacitance of the MOS transistor 63 operating in the saturation region is almost completely distributed in the gate-source path, so that only a small amount of a variation component of the node voltage $V_{B1}$ leaks to an inverting input 82. Such a leaked component can be neglected. In order to completely eliminate a leaked component through the gate-drain capacitance $C_{gd}$ of the MOS transistor 63, two P-channel MOS transistors 61A and 62A are added as shown in FIG. 10. By utilizing the fact that the voltage $V_{gs}$ of the P-channel transistor 61A does not change if the operating current thereof is kept constant, a voltage $V_{B1'}$ at the node between the drains of the MOS transistors 61A and 63 can be stabilized.

When the operating current of each gain-stage is kept constant, the power supply voltage variation component may not be substantially transmitted to the signal line. However, since the power supply rejection ratio caused by a change in the threshold voltage of the second gain stage may not be degraded by negative feedback, the feedback signal at the high frequency range is decreased, thus degrading the power supply rejection ratio.

The $V_{DD}$ noise detector 73 serves to stabilize the operating point of the gain-stage. By utilizing a frequency compensation capacitor 85, the gate voltage of the transistor 66 for driving the gain stage is changed to have the same phase as the variation component of the voltage at the source of the transistor 66 together with the variation in the power supply voltage $V_{DD}$. As a result, the voltage $V_{gs}$ of the transistor 66 is kept constant. In order to generate, at the node between the drain and a source of the MOS transistors 68 and 69, a voltage $V_{B4}$ having the same waveform as that of the $V_{DD}$ variation component, a voltage having a phase opposite to that of the variation component of the power supply voltage $V_{DD}$ is applied by the $V_{DD}$ noise detector 73 to the gate of the MOS transistor 68.

Figure 11A:
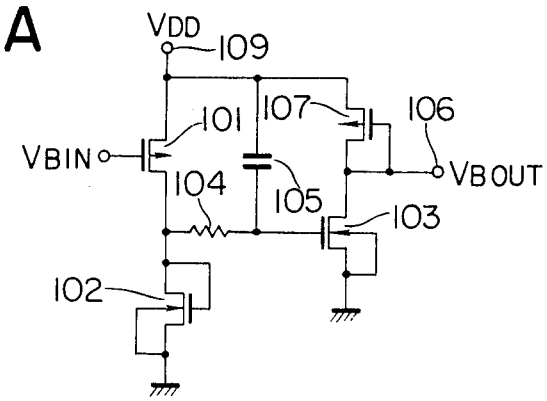
FIGS. 11A and 11B are circuit diagrams respectively showing $V_{DD}$ noise detectors for the operational amplifier shown in FIG. 7.
Figure 11B:
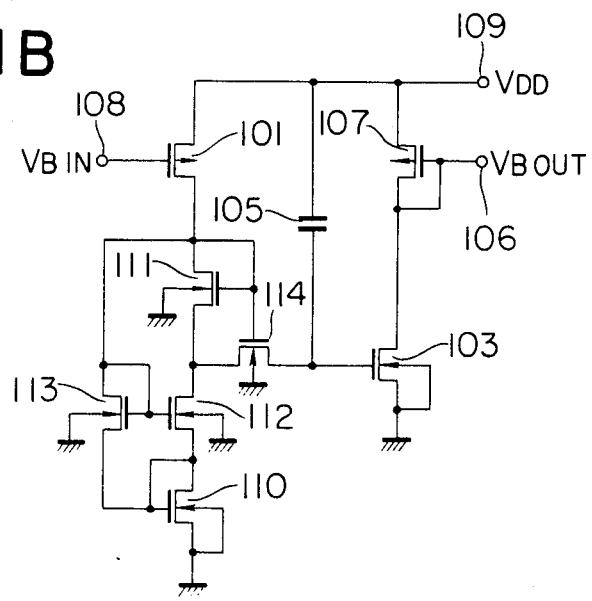
Figure 12:
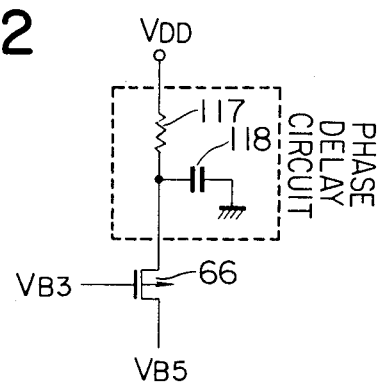
FIG. 12 is a block diagram of a noise phase correction circuit for correcting noise of a drive transistor of a gain stage of the operational amplifier shown in FIG. 7.

FIGS. 11A and 11B show two different $V_{DD}$ noise detectors. In the $V_{DD}$ noise detector shown in FIG. 11A, a bias voltage to be applied to a MOS transistor 103 is produced by MOS transistors 101 and 102. An AC variation component of the power supply voltage $V_{DD}$ is applied by a resistor 104 and a capacitor 105 to the gate of the MOS transistor 103, thereby obtaining, at an output 106, a voltage $V_{BOUT}$ having a phase opposite to that of the variation component of the power supply voltage $V_{DD}$. A transconductance (gm) of a MOS transistor 107 is designed to be smaller than that of the MOS transistor 103. FIG. 11B shows a $V_{DD}$ noise detector which has the same arrangement as that shown in FIG. 11A, except that the resistor 104 is replaced with a MOS circuit since the time constant which is determined by the resistor 104 and the capacitor 105 is so great as to require a large area on the IC chip. A bias voltage to be applied to a MOS transistor 103 is produced by MOS transistors 101 and 110. A voltage $V_{gs}$ of a MOS transistor 114 is then biased by MOS transistors 111, 112 and 113 to be a voltage slightly higher than its threshold voltage. As a result, a high ON resistance of the MOS transistor 114 is used for a resistance to determine the time constant. A negative amplifier which comprises the MOS transistors 103 and 107 is used in each of the $V_{DD}$ noise detectors shown in FIGS. 11A and 11B, so that a phase delay occurs in a high frequency range. In order to correct such a phase delay, a phase delay circuit of a resistor 117 and a capacitor 118 may be inserted between the source of the transistor 66 (FIG. 7) of the gain stage and the power supply voltage $V_{DD}$, as shown in FIG. 12. Since the time constant which is determined by the resistor 117 and the capacitor 118 is very small, it is easy to build the resistor and the capacitor into the IC chip.

By utilizing the regulated operational amplifier of the type described above, the power supply rejection ratio (PSRR) of the switched capacitor circuit is greatly improved. In the operational amplifier shown in FIG. 7, the operating current of each stage is determined by the N-channel MOS transistor. However, as may be apparent from the operation characteristics of the CMOS-FETs, a P-channel MOS transistor may be used to obtain the same effect.

Figure 13A:
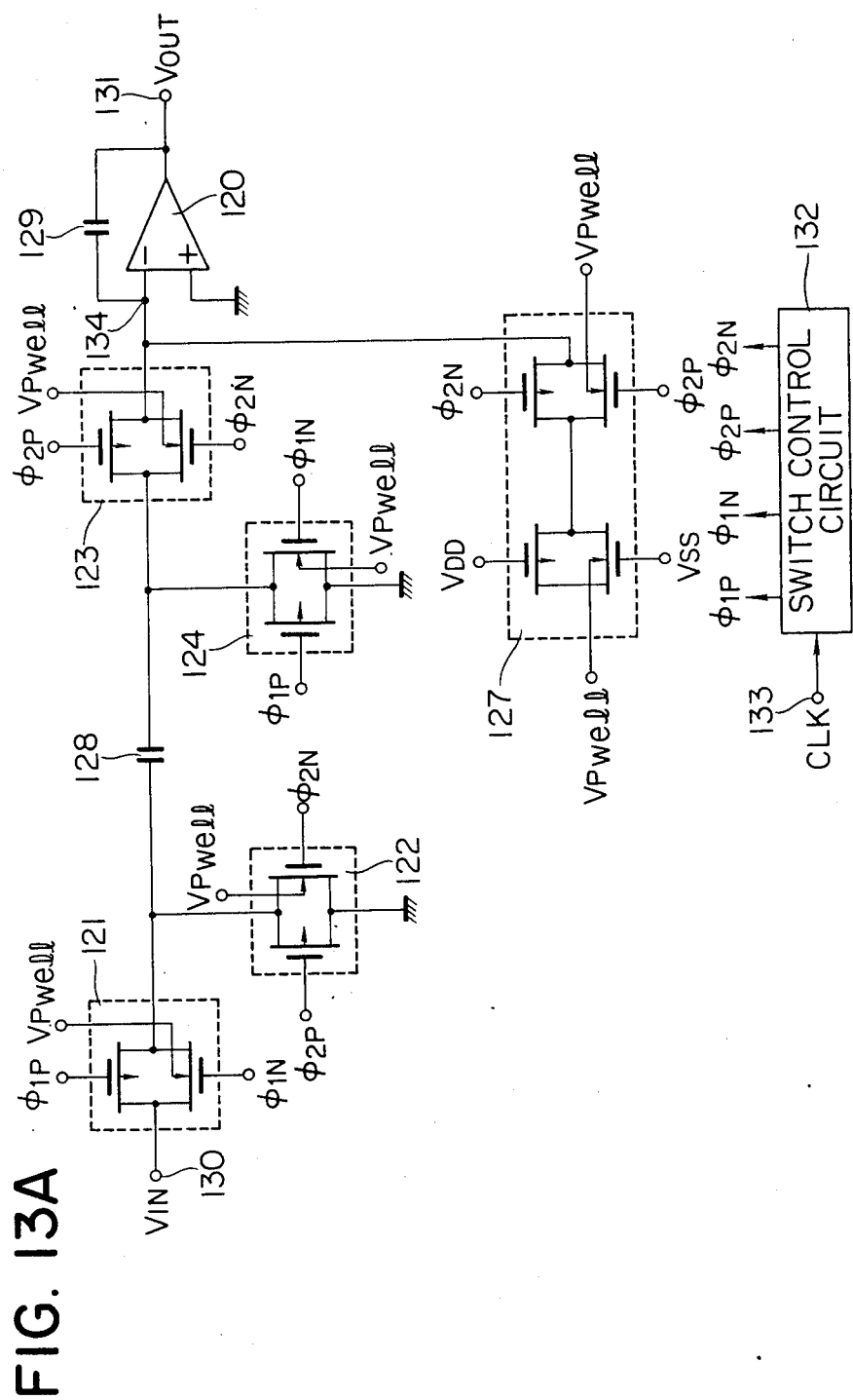
FIGS. 13A and 13B are circuit diagrams showing a switched capacitor circuit according to an embodiment of the present invention, where
Figure 13B:
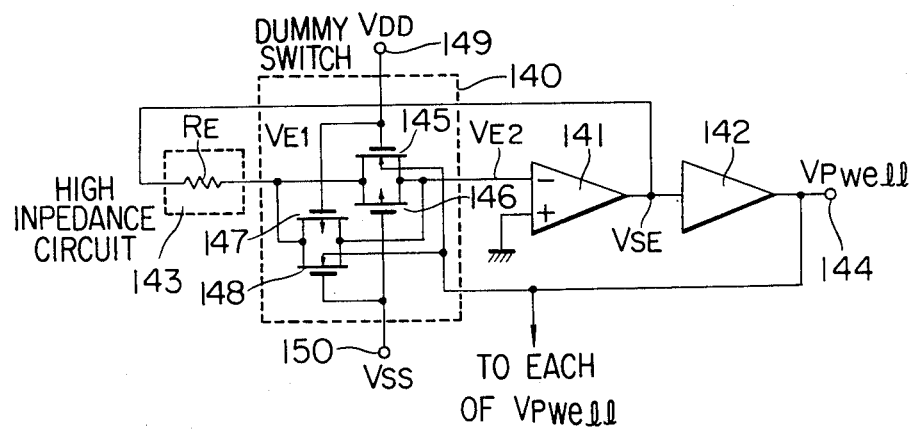

FIGS. 13A and 13B show a switched capacitor circuit which includes the CMOS operational amplifier described above according to the embodiment of the present invention. FIG. 13A shows the main part of the switched capacitor circuit; and FIG. 13B shows a substrate bias circuit for applying a voltage to the P-well of the N-channel MOS transistor which constitutes the analog switch.

More particularly, FIGS. 13A and 13B show circuit arrangements for eliminating the second cause of degradation of the power supply rejection ratio. Each of analog switches 121, 122, 123 and 124 is arranged to have the CMOS operational amplifier configuration shown in FIG. 2 and one additional input P-well which is connected to the P-well of the N-channel MOS transistor of each of the analog switches 121, 122, 123 and 124. The analog switches 121, 122, 123 and 124 correspond to the analog switches 6, 7, 8 and 9 shown in FIG. 1, respectively. A sampling capacitor 128 and an integrating capacitor 129 in FIG. 13A correspond to the sampling capacitor 5 and the integrating capacitor 4 in FIG. 1, respectively. An operational amplifier 120 corresponds to the operational amplifier shown in FIG. 7.

The substrate bias circuit has the following arrangement and function. A dummy switch 140 which is the same as the analog switch used in the switched capacitor circuit is prepared to detect a power supply noise component. The detected power supply noise component is amplified by a noise detector amplifier 141 so as to generate a voltage $V_{Pwell}$ for eliminating the power supply noise component leaked to the signal line through the analog switch of the switched capacitor circuit. Then the voltage $V_{Pwell}$ is applied to the input P-well of each analog switch, thereby eliminating the second cause of degradation of the power supply rejection ratio. A switch control circuit 132 may comprise a conventional switch control circuit. Without changing any electrical characteristic of the switched capacitor circuit, the power supply rejection ratio can thus be improved.

The leakage of the variation component of the power supply voltage from the analog switch, which results in the second cause, is detected and amplified by the noise detector amplifier 141. The dummy switch 140 has the same arrangement as the analog switch used in the switched capacitor circuit. The dummy switch 140 receives a DC voltage from a high impedance circuit 143. It should be noted that this DC voltage corresponds to substantially the ground potential. This is because the capacitances $C_{gs}$, $C_{gd}$, $C_{sb}$ and $C_{db}$ of the MOS transistor have dependency on the input-output voltage characteristics. When the DC voltage is grounded, the dummy switch 140 transmits the power supply variation component in the same manner as in the switch of the switched capacitor circuit. A level shifter 142 converts the DC component to the voltage $V_{Pwell}$ (ranging between about $V_{SS}$ to about $V_{SS}+1$). This is because an output voltage $V_{SE}$ from the switch noise detector amplifier 141 is grounded by DC feedback. The AC component of the power supply variation which is detected and amplified is subjected to AC coupled feed back through the P-well region of the N-channel MOS transistor of the dummy switch 140 and through the capacitances $C_{db}$ and $C_{sb}$. As a result, the voltage $V_{Pwell}$ is obtained at an output 144 to have a waveform such as to cancel the power supply variation component. In the switched capacitor circuit, the charging/discharging condition of the capacitor connected to an inverting input 134 of the operational amplifier 120 is changed in accordance with the ON/OFF condition of the analog switches. When the dummy switch 140 comprises two bistable switches each having ON and OFF states (i.e., a switch of MOS transistors 147 and 148 and a switch of MOS transistors 145 and 146), and a correction switch 127 is added to the switched capacitor circuit as shown in FIG. 13A, the dummy switch 140 provides a circuit symmetry to the correction switch 127, thereby eliminating the power supply variation. However, if the dummy switch 140 comprises two normally-ON switches and the correction switch 127 is omitted, only a small part of the power supply variation is remains non-eliminated. The correction switch 127 is turned on/off in the opposite manner to the analog switch 123. This is to assure that the parasitic capacitances of the dummy switch remains the same as that of the main switch due to changes in the gate capacitance in accordance with the ON/OFF states of the switches.

Figure 14:
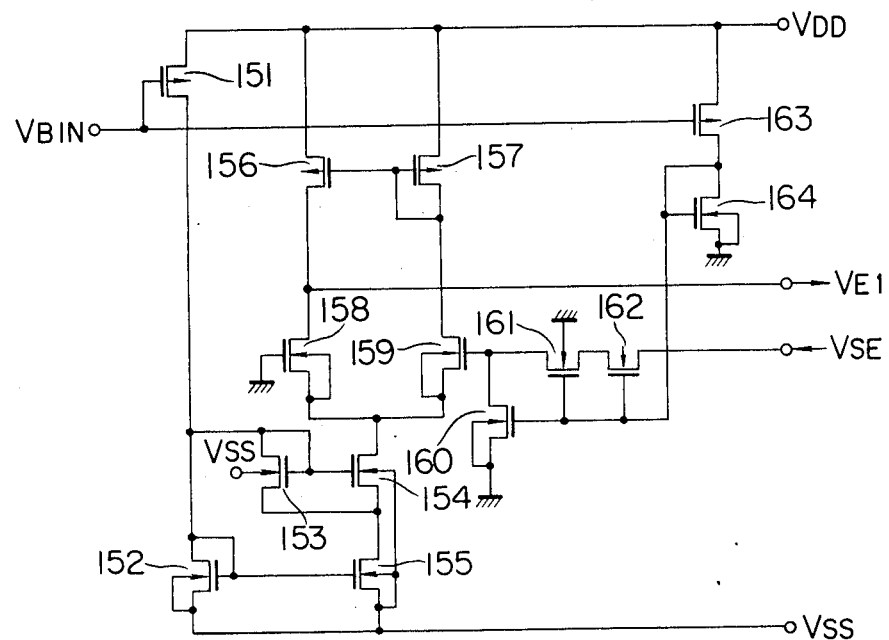
FIG. 14 is a circuit diagram of a high impedance circuit used for a substrate bias circuit shown in FIG. 13B.

FIG. 14 shows another arrangement of the high impedance circuit 143 shown in FIG. 13B. As shown in FIG. 13B, a high impedance circuit can be realized by a high resistance $R_E$. However, in order to decrease the area occupied by the high impedance circuit, a high impedance circuit as shown in FIG. 14 is very effective. This high impedance circuit utilizes a high output impedance of the differential amplifier. The high impedance circuit comprises: a bias circuit consisting of MOS transistors 151 to 153; a differential amplifier consisting of MOS transistors 154 to 159; an attenuator for stabilizing the circuit by decreasing only a gain of a DC feedback loop of MOS transistors 160 to 162; and a bias circuit consisting of MOS transistors 163 and 164 so as to apply a bias voltage to the transistors 160 to 162. By the circuit arrangement which comprises the MOS transistors 152 to 155, the operating current of the differential amplifier is decreased, thereby obtaining a high output impedance.

Figure 15:
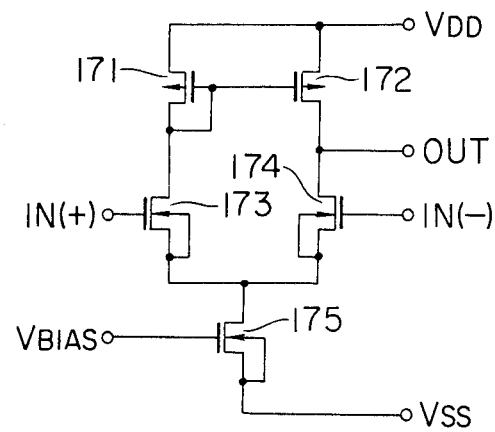
FIG. 15 is a circuit diagram of a noise detector amplifier used for the substrate bias circuit shown in FIG. 13B.

FIG. 15 shows a noise detector amplifier which comprises a single differential stage of MOS transistors 171 to 175.

Figure 16:
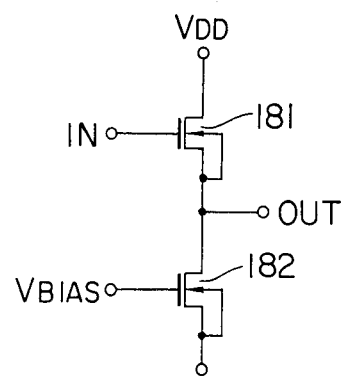
FIG. 16 is a circuit diagram of a level shifter having a source follower, the level shifter being used for the substrate bias circuit.

FIG. 16 shows a level shifter which comprises MOS transistors 181 and 182, utilizing the source follower.

Figure 17:
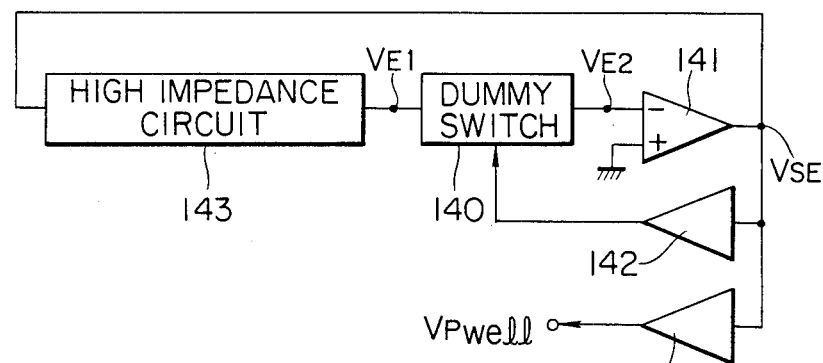
FIG. 17 shows a substrate bias circuit having two level shifters.

The output voltage $V_{Pwell}$ from the level shifter 142 shown in FIG. 13B is commonly supplied to the P-well of the dummy switch 140 and to the P-well of the analog switch for the switched capacitor circuit. In this case, the switch control signal is supplied from the latter switch to the P-well since the level shifter has a finite output impedance. When the switch control signal is supplied to the P-well of the dummy switch 140, the power supply variation component may not be completely eliminated. In order to completely eliminate it, two level shifters 142 and 142' may be used to isolate the P-well, as shown in FIG. 17.

Figure 18:
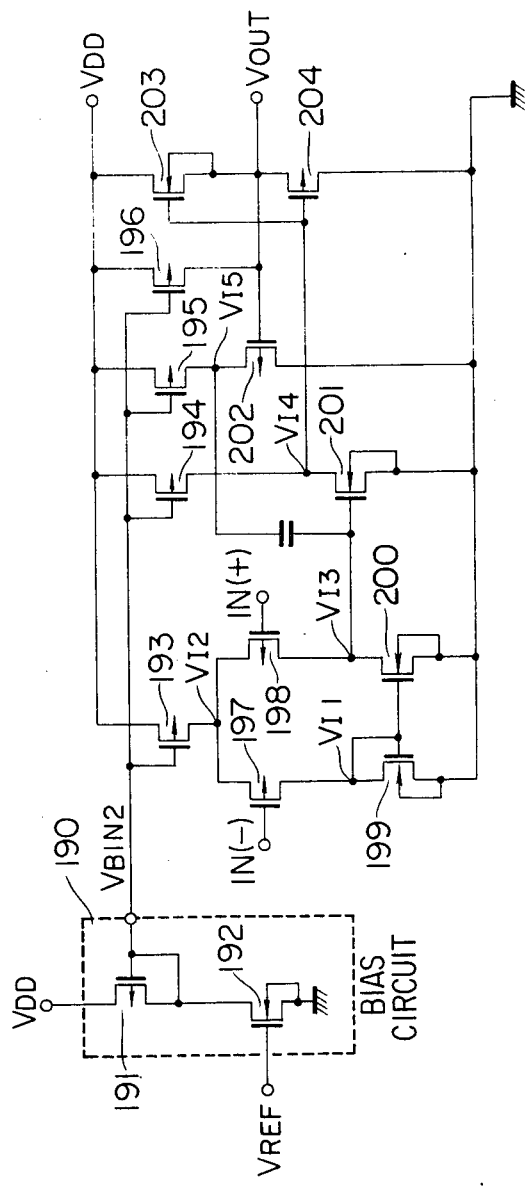
FIG. 18 is a circuit diagram of another CMOS operational amplifier of a switched capacitor circuit, the CMOS operational amplifier being operated by a single power supply.

FIG. 18 shows a case in which an operational amplifier of a switched capacitor circuit is operated when the positive and negative power supply voltages $V_{DD}$ and $V_{SS}$ are not used, but only the positive power supply voltage $V_{DD}$ is used, and the ground potential is defined as a voltage $V_{DD}/2$. If the voltage $V_{DD}/2$ is stabilized only with respect to the power supply voltage $V_{DD}$, the voltage $V_{DD}/2$ must be controlled to keep the operating current constant with respect to the variation in the power supply voltage $V_{DD}$. For this purpose, a bias circuit 190 which is obtained by eliminating the MOS transistors 92 and 93 from the bias circuit (FIG. 8) biases P-channel MOS transistors 193 to 196 so as to only regulate the operating current of each stage.

Figure 19:
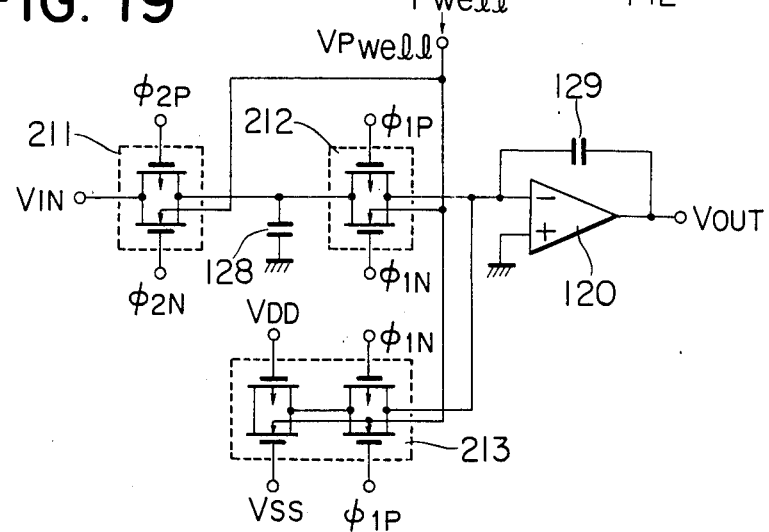
FIG. 19 is a circuit diagram of a switched capacitor circuit according to another embodiment of the present invention.

FIG. 19 shows a switched capacitor circuit, which has a capacitor array different from that shown in FIG. 13, according to a second embodiment of the present invention. In this embodiment, two analog switches 211 and 212 are used to charge the sampling capacitor 128, and to discharge the capacitor 128, and then to charge the integrating capacitor 129 by the charge discharged from the capacitor 128. A substrate bias circuit and a switch control circuit are not illustrated in FIG. 19. A correction switch 213 has the same arrangement as that shown in FIG. 13 and has the same effect.

Figure 20A:
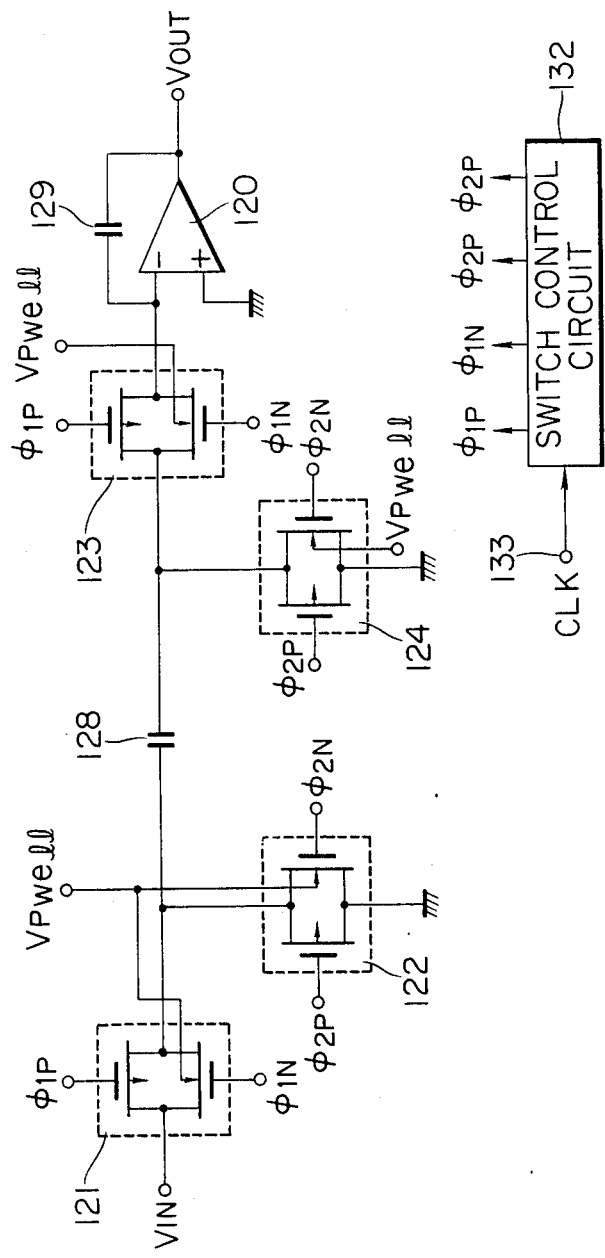
FIGS. 20A and 20B are circuit diagrams of a switched capacitor circuit which eliminates a correction switch according to still another embodiment of the present invention.
Figure 20B:
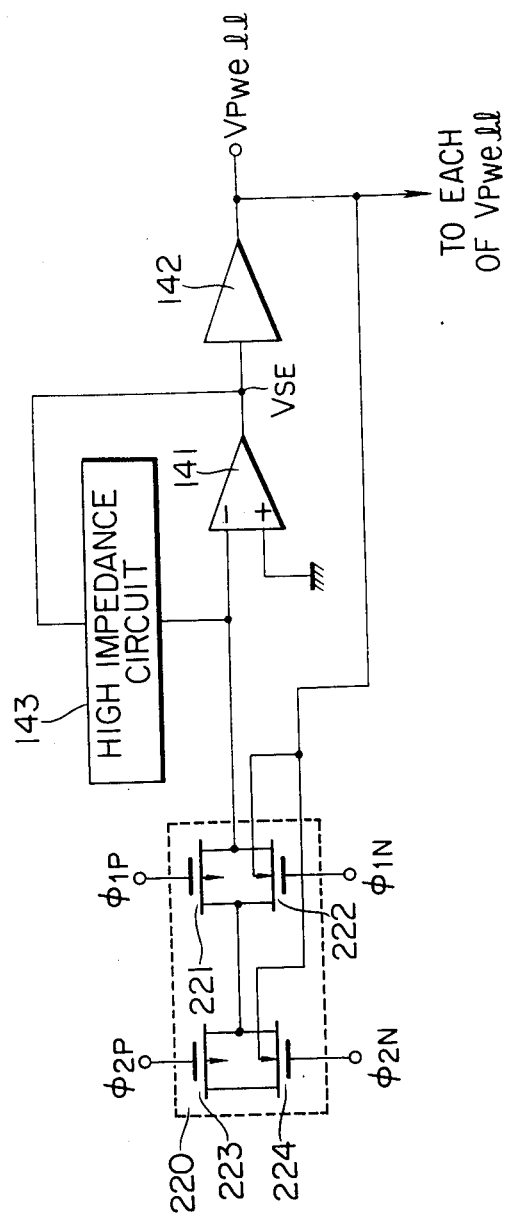

FIGS. 20A and 20B show a switched capacitor circuit which eliminates a correction switch, according to still another embodiment of the present invention. FIG. 20A shows the switched capacitor circuit which is obtained by omitting the correction switch from the switched capacitor circuit shown in FIG. 13A; and FIG. 20B is a substrate bias circuit therefor. A dummy switch 220 of the substrate bias circuit is turned on/off in accordance with the switch control signal. For this reason, the correction switch can be eliminated. The substrate bias circuit using the dummy switch 220 can be applied to a circuit which uses only one switched capacitor circuit, as well as to a circuit which comprises a plurality of switched capacitor circuits but is operated in accordance with a single timing signal.

The switched capacitor circuit of a high power supply rejection ratio can be obtained by: an operational amplifier for preventing the power supply voltage variation from leaking to the signal line by keeping the operating current constant using the reference voltage $V_{REF}$ which is independent of the power supply variation; and a substrate bias circuit for cancelling the power supply voltage variation leaked from the parasitic capacitance of the switch through the path between the substrate and the source (or drain) or the path between the gate and source (or drain) of the MOS transistor of the switch. The switched capacitor circuit having a high power supply rejection ratio according to the present invention can be manufactured at low cost, a high S/N ratio can be guaranteed even if a power supply voltage from the switching regulator power supply has many noise components, thereby eliminating an expensive, high-performance power supply and resulting in convenience. Furthermore, according to the present invention, in the case of forming the switched capacitor circuit and the logic circuit on the same substrate, the pulsive noise component from the logic circuit may not leak to the switched capacitor circuit through the common power supply wiring layer and the substrate. Therefore, a high-performance large scale integrated circuit can be readily realized. Furthermore, according to the present invention, the integrated circuit which includes the switched capacitor circuit so as to process an analog signal can be formed on the same chip together with the logic circuits, and the same power supply can be used, so that an economical, compact circuit can be manufactured.

What is claimed is:

1. A switched capacitor circuit having an integrating capacitor; an operational amplifier having an output end and an inverting input end between which said integrating capacitor is connected; a sampling circuit having an analog switch and a sampling capacitor, said sampling circuit being connected between a signal input end and said inverting input end of said operational amplifier; and a switch control circuit for controlling said analog switch, said switched capacitor circuit comprising:
   a current regulation bias circuit for supplying a bias voltage to a constant current circuit so as to determine the operating current of a differential stage of said operational amplifier in accordance with a stable reference voltage applied to said bias circuit which is substantially free from the influence of a variation in a power supply voltage supplied to said switched capacitor circuit so that the operating current of said differential stage is free from the influence of the variation in the power supply voltage, said operational amplifier including a gain stage after said differential stage, said current regulation bias circuit comprising: a first MOS transistor which receives the reference voltage at a gate-source path thereof; a second MOS transistor connected in series with said first MOS transistor; a third MOS transistor, the drain and gate of which are respectively connected to the drain and gate of said second MOS transistor, said third MOS transistor constituting a current mirror circuit together with said second MOS transistor; and a fourth transistor connected in series with said third MOS transistor so as to have a constant gate-source voltage which is substantially free from the influence of the variation in the power supply voltage due to supply of constant current from said current mirror circuit, wherein the gate and source of said fourth transistor are connected to the gate and source, respectively, of a MOS transistor of said constant current circuit for determining the operating current of said operational amplifier.

2. A circuit according to claim 1 comprising filter means for filtering the power supply voltage of noise components before said power supply voltage is supplied to said swtiched capacitor circuit.

3. A circuit according to claim 1 wherein the reference voltage is supplied externally of said switched capacitor circuit.

4. A circuit according to claim 1, wherein said current regulation bias circuit regulates current flowing through said gain stage of said operational amplifier.

5. A switched capacitor circuit having: an integrating capacitor; an operational amplifier having an inverting input end, a differential stage connected to said input end, a gain stage connected to said differential stage for amplifying a single-ended output signal from said differential stage to supply an output signal for the operational amplifier, and a frequency compensation buffer connected to said stages, said operational amplifier having an output end, said integrating capacitor being connected between said input and output ends; a sampling circuit having an analog switch and a sampling capacitor, said sampling circuit being connected between a signal input end and said inverting input end of said operational amplifier; and a switch control circuit for controlling said analog switch, said switched capacitor circuit comprising:
   a current regulation bias circuit for supplying a bias voltage to a constant current circuit so as to determine the operating current of the differential stage of said operational amplifier in accordance with a substantially stable reference voltage which is free from the influence of a variation in a power supply voltage supplied to said switched capacitor circuit so that the operating current of said differential stage is free from the influence of the variation in the power supply voltage; and
   an operating point stabilizing circuit for detecting a variation component of the power supply voltage, for supplying a detected variation component having the same phase as a phase of alternating noise voltage in the power supply voltage to said gain stage of said operational amplifier.

6. A circuit according to claim 5, wherein said operating point stabilizing circuit comprises: a voltage variation component detector having a series circuit of a high resistive element and a capacitive element, said high resistive element having one end connected to a voltage source which is substantially free from the influence of the variation in the power supply voltage, and said capacitive element having one end connected to the power supply voltage; and a connection such as to add the detected variation component to a bias voltage of a transistor for determining the operating current of said frequency compensation buffer, whereby the variation component is applied to a gate of a transistor of said gain stage through said frequency compensating buffer and a frequency compensation capacitor, thereby keeping the gate-source voltage of said transistor of said gain stage constant.

7. A circuit according to claim 7, wherein said high resistive element comprises a MOS circuit.

8. A switched capacitor circuit having: an integrating capacitor; an operational amplifier having an inverting input end, a differential stage connected to said input end, a gain stage connected to said differential stage for amplifying a single-ended output signal from said differential stage to supply an output signal for the operational amplifier, and a frequency compensation buffer connected to said stages, said operational amplifier having an output end, said integrating capacitor being connected between said input and output ends; a sampling circuit having an analog switch and a sampling capacitor, said sampling circuit being connected between a signal input end and said inverting input end of said operational amplifier; and a switch control circuit for controlling said analog switch, said switched capacitor circuit comprising:
- a current regulation bias circuit for supplying a bias voltage to a constant current circuit so as to determine the operating current of said differential stage of said operational amplifier in accordance with a stable reference voltage which is substantially free from the influence of a variation in a power supply voltage supplied to said switched capacitor circuit so that the operating current of said differential stage is free from the influence of the variation in the power supply voltage;
- an operating point stabilizing circuit for detecting a variation component of the power supply voltage, for supplying a detected variation component having the same phase as a phase of alternating noise voltage in the power supply voltage to said gain stage of said operational amplifier; and
- a substrate bias circuit for detecting a leakage component of the variation in the power supply voltage which is transmitted to a signal line through a parasitic capacitance of a transistor of said analog switch, for producing an inverted voltage having a phase opposite to a phase of the leakage component, and for applying the inverted voltage to a substrate of said analog switch, thereby cancelling the leakage component.

9. A circuit according to claim 8, wherein said analog switch comprises a P-channel MOS transistor and an N-channel MOS transistor, which is isolated from a substrate of said P-channel MOS transistor by a P-type element isolation diffusion layer (P-well); and
said substrate bias circuit comprises:
- a dummy switch which has the same arrangement as said analog switch;
- a detector amplifier for detecting the leakage component of the variation in the power supply voltage which appears at an output end of said dummy switch through a parasitic capacitance of said dummy switch;
- a level shifter for converting a DC level of an output signal from said detector amplifier to a level of a P-well voltage required for a switching operation of said analog switch;
- a feedback circuit for AC coupled feed back of an output signal from said level shifter to said P-type element isolation diffusion layer of said dummy switch; and
- a connector circuit for applying the inverted voltage to said P-type element isolation diffusion layer of said analog switch, the inverted voltage being obtained at an output end of said level shifter.

10. A circuit according to claim 9, wherein said dummy switch comprises an ON analog switch and an OFF analog switch, and a correction analog switch is connected to said inverting input end of said operational amplifier.

11. A circuit according to claim 9, wherein said output end of said detector amplifier is connected to an additional shifter, an output signal from said additional level shifter being supplied to the P-type element isolation diffusion layer of said analog switch.

12. A switched capacitor circuit having: an integrating capacitor; an operational amplifier having an inverting input end, a differential stage connected to said input end, a gain stage connected to said differential stage for amplifying a single-ended output signal from said differential stage to supply an output signal for the operational amplifier, and a frequency compensation buffer connected to said stages, said operational amplifier having an output end, said integrating capacitor being connected between said input and output ends; a sampling circuit having an analog switch and a sampling capacitor, said sampling circuit being connected between a signal input end and said inverting input end of said operational amplifier; and a switch control circuit for controlling said analog switch, said switched capacitor circuit comprising:
- an operating point stabilizing circuit for detecting a variation component of the power supply, for supplying a detected variation component having the same phase as the phase of alternating noise voltage in the power supply voltage to said gain of said operational amplifier, and thereby stabilizing the operation of said gain stage.

13. A circuit according to claim 12, wherein said operating point stabilizing circuit comprises: a voltage variation component detector having a series circuit of a high resistive element and a capacitive element, said high resistive element having one end connected to a voltage source which is substantially free from the influence of the variation in the power supply voltage, and said capacitive element having one end connected to the power supply voltage; and a connection such as to add the detected variation component to a bias voltage of a transistor for determining the operating current of said frequency compensation buffer, whereby the voltage variation component is applied to a gate of a transistor of said gain stage through said frequency compensating buffer and a frequency compensation capacitor, thereby keeping the gate-source voltage of said transistor constant.

14. A switched capacitor circuit having an integrating capacitor; an operational amplifier having an output end and an inverting input end between which said integrating capacitor is connected; a sampling circuit having an analog switch and a sampling capacitor, said sampling circuit being connected between a signal input end and said inverting input end of said operational amplifier; and a switch control circuit for controlling said analog switch, said switched capacitor circuit comprising
a substrate bias circuit for detecting a leakage component of the variation in the power supply voltage which is transmitted to a signal line through a parasitic capacitance of a transistor of said analog switch, for producing an inverted voltage having a phase opposite to a phase of the leakage component, and for applying the inverted voltage to a substrate of said analog switch, thereby cancelling the leakage component.

15. A circuit according to claim 14, wherein said analog switch comprises a P-channel MOS transistor and an N-channel MOS transistor, which is isolated from a substrate of said P-channel MOS transistor by a P-type element isolation diffusion layer (P-well); and said substrate bias circuit comprises:

a dummy switch which has the same arrangement as said analog switch;

a detector amplifier for detecting the leakage component of the variation in the power supply voltage which appears at an output end of said dummy switch through a parasitic capacitance of said dummy switch;

a level shifter for converting a DC level of an output signal from said detector amplifier to a level of a P-well voltage required for a switching operation of said analog switch;

a feedback circuit for AC coupled feed back of an output signal from said level shifter to said P-type element isolation diffusion layer of said dummy switch; and a connector circuit for applying the inverted voltage to said P-type element isolation diffusion layer of said analog switch, the inverted voltage being obtained at an output end of said level shifter.

16. A switched capacitor circuit having: an integrating capacitor; an operational amplifier having an inverting input end, a differential stage connected to said input end; a gain stage connected to the differential stage for amplifying a single ended output signal from said differential stage to supply an output signal for the operational amplifier, and a frequency compensation buffer connected to the stages, said operational amplifier having an output end, said integrating capacitor being connected between said input and output ends; a sampling circuit having an analog switch and a sampling capacitor, said sampling circuit being connected between a signal input end and the inverting input end of said operational amplifier; and a switch control circuit for controlling said amalog switch, said switched capacitor circuit comprising;

a current regulation bias circuit for supplying a bias voltage to a constant current circuit so as to determine the operating current of said differential stage of said operational amplifier in accordance with a stable reference voltage which is substantially free from the influence of a variation in a power supply voltage supplied to said switched capacitor circuit so that the operating current of said differential stage is free from the influence of the variation in the power supply voltage; and a substrate bias circuit for detecting a leakage component of the variation in the power supply voltage which is transmitted to a signal line through a parasitic capacitance of a transistor of said analog switch, for producing an inverted voltage having a phase opposite to a phase of the leakage component, for applying the inverted voltage to a substrate of said analog switch, and for cancelling the leakage component.

17. A switched capacitor circuit having: an integrating capacitor; an operational amplifier having an inverting input end, a differential stage connected to said input end, a gain stage connected to the differential stage for amplifying a single ended output signal from said differential stage to supply an output signal for the operational amplifier, and a frequency compensation buffer connected to said stages, said operational amplifier having an output end, said integrating capacitor being connected between said input and output ends; a sampling circuit having an analog switch and a sampling capacitor, said sampling circuit being connected between a signal input end and the inverting input end of said operational amplifier; and a switch control circuit for controlling said analog switch, said switched capacitor circuit comprising:

an operating point stabilizing circuit for detecting a variation component of the power supply voltage, for supplying a detected variation component having the same phase as a phase of alternating noise voltage in the power supply voltage to said gain stage of said operational amplifier; and a substrate bias circuit for detecting a leakage component of the variation in the power supply voltage which is transmitted to a signal line through a parasitic capacitance of a transistor of said analog switch, for producing an inverted voltage having a phase opposite to a phase of the leakage component, for applying the inverted voltage to a substrate of said analog switch, and for cancelling the leakage component.

* * * * *